United States Patent
Wolak

(10) Patent No.: US 9,316,846 B2
(45) Date of Patent: Apr. 19, 2016

(54) SYSTEMS AND METHODS TO PROVIDE HIGH BRIGHTNESS DIODE LASER OUTPUTS

(71) Applicant: Edmund L. Wolak, Palo Alto, CA (US)

(72) Inventor: Edmund L. Wolak, Palo Alto, CA (US)

(*) Notice: Subject to any disclaimer, the term of this patent is extended or adjusted under 35 U.S.C. 154(b) by 23 days.

(21) Appl. No.: 13/939,974

(22) Filed: Jul. 11, 2013

(65) Prior Publication Data

US 2015/0015952 A1    Jan. 15, 2015

(51) Int. Cl.
| | |
|---|---|
| H01S 3/00 | (2006.01) |
| G02B 27/28 | (2006.01) |
| H01S 5/40 | (2006.01) |
| H01S 3/05 | (2006.01) |

(52) U.S. Cl.
CPC ............ *G02B 27/283* (2013.01); *H01S 5/4012* (2013.01); *H01S 3/05* (2013.01)

(58) Field of Classification Search
CPC ...... H01S 3/005; H01S 5/4012; G02B 27/283
USPC ........................................................ 359/349
See application file for complete search history.

(56) References Cited

U.S. PATENT DOCUMENTS

| | | | | |
|---|---|---|---|---|
| 5,586,132 | A | * | 12/1996 | Levy .................. 372/23 |
| 5,841,557 | A | * | 11/1998 | Otsuka et al. ........... 398/65 |
| 6,411,323 | B1 | * | 6/2002 | Waarts et al. ........... 347/241 |
| 6,452,720 | B1 | | 9/2002 | Naganuma et al. |
| 6,600,582 | B1 | | 7/2003 | Liu et al. |
| 7,949,030 | B2 | | 5/2011 | Volodin |
| 8,427,749 | B2 | | 4/2013 | Du et al. |
| 2003/0223670 | A1 | | 12/2003 | Nikolov et al. |
| 2007/0229939 | A1 | | 10/2007 | Brown et al. |
| 2009/0190218 | A1 | * | 7/2009 | Govorkov et al. ........... 359/495 |
| 2011/0216417 | A1 | | 9/2011 | Chann et al. |
| 2011/0305256 | A1 | * | 12/2011 | Chann et al. ........... 372/75 |
| 2013/0215923 | A1 | * | 8/2013 | Cobb ................. 372/49.01 |

FOREIGN PATENT DOCUMENTS

JP            09152639 A      6/1997

* cited by examiner

*Primary Examiner* — Mark Hellner
(74) *Attorney, Agent, or Firm* — JP Webb; Jason P. Webb; Denny Y. H. Cheng

(57) ABSTRACT

A high brightness, high power laser output is produced using a technique of splitting the outputs of multiple laser diode sources into two polarization states, wavelength combining the first polarization state from the multiple laser diodes, separately wavelength combining the second polarization state from the multiple laser diodes, and recombining the two polarized wavelength combined beams using a polarization combiner.

23 Claims, 7 Drawing Sheets

SYSTEMS AND METHODS TO PROVIDE HIGH BRIGHTNESS DIODE LASER OUTPUTS

BACKGROUND

1. Field of the Invention

The present invention relates to high brightness, high power laser diode systems.

2. Description of Related Art

In the field of high power laser diodes, certain applications are limited by the available brightness emitted by laser diodes. The available brightness may be limited by spatial and spectral brightness distributions.

Spatial brightness is typically optical power divided by spatial angle (beam divergence) and focused spot size. It is desirable to have low divergence beams for many applications, including coupling the beams into fiber optics. Spectral brightness is the width of the spectral band of the beam. In many applications it is desirable to produce beams with relatively narrow spectral bands, for controlled interaction with the target of the beam. In other applications, the wider spectral bands are acceptable.

To reach high brightness levels, outputs of multiple laser diodes have been used. One technology for combining beams from multiple diode lasers is described in U.S. Pat. No. RE40,173 titled "High Efficiency, High Power, Direct Diode Laser Systems and Methods Therefor" by Mark Zediker, et al. However, large arrays of laser diode sources needed to achieve high output powers for combined beams present practical issues with use of beam combiners of the prior art. For example, because of the need to mount such large arrays in configurations that allow for efficient delivery of power, effective cooling and for low cost manufacturing, blocks of fiber coupled, laser diodes have been developed. The fiber coupling however reduces beam quality, and therefore the efficiency of the beam combining technologies.

SUMMARY

High brightness, high power laser outputs can be developed using a technique of splitting, collimated outputs of multiple, line-narrowed laser sources, such as unpolarized outputs of fiber delivered beams from laser diodes, into two sets of polarized beams. The two sets of polarized, line-narrowed beams are combined using a first set of Fabry Perot filters configured for wavelength combining beams in polarization state of the first set onto a first common beam line, and a second set of Fabry Perot filters configured for separately wavelength combining beams in the polarization state of the second set onto a second common beam line. The wavelength combined beams on the first and second common beam lines can then be combined using a polarization combiner, which produces a collimated beam of high brightness, from an array of unpolarized sources.

Other aspects and advantages of the present invention can be seen on review of the drawings, the detailed description and the claims, which follow.

DETAILED DESCRIPTION

A detailed description of embodiments of the present invention is provided with reference to the FIGS. 1-7. In the figures, optical elements are illustrated that are in functional communication (optically coupled) wherein the elements are positioned (location and/or orientation set as necessary) and/or coupled by other devices/structures (fiber optic cables, etc.) in a manner that any output beam(s) from any preceding element(s) (element(s) in the upstream path of a beam) are properly received by such elements so that their intended function may be realized.

Figure 1A:
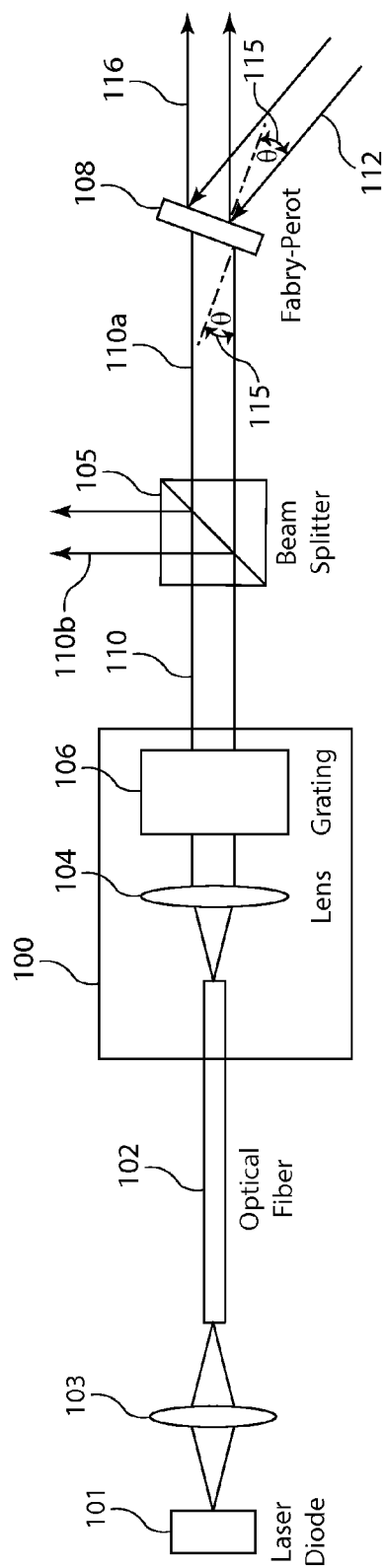
FIG. 1 (FIGS. 1a and 1b collectively) illustrates a technique to spectrally narrow the output beam of a laser diode and using a Fabry-Perot filter to combine beams having different center frequencies.
Figure 1B:
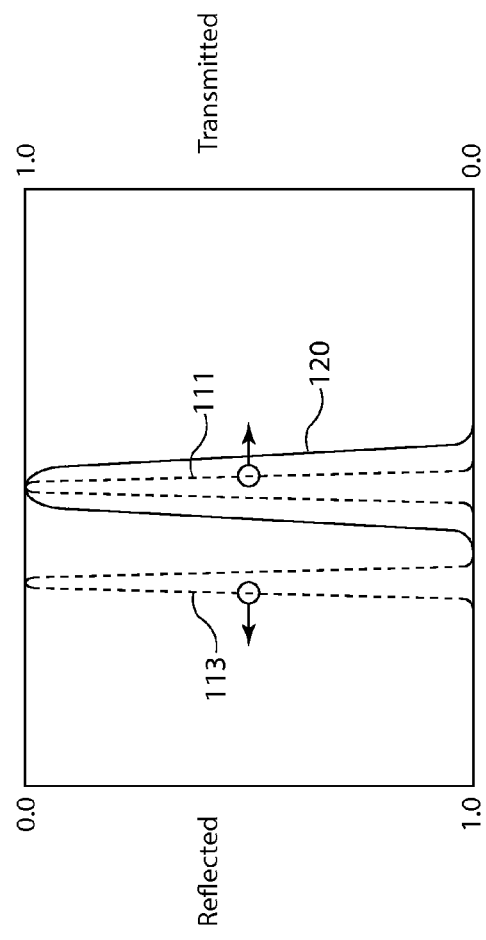

FIG. 1 illustrates spectrally combining beams from two laser diode sources using a Fabry-Perot filter 108. By correctly choosing a Bragg grating 106 to narrow the linewidth of a laser diode source 102 and the parameters of the Fabry-Perot filter 108, one can design filters such that at a given angle $\theta$ 115, the spectrally narrowed output 110 of a laser diode source 102 passes through the Fabry-Perot filter 108 while all other wavelengths are reflected. A second laser diode beam 112 having a narrow linewidth with a different center wavelength and spectral shape 113 impinges Fabry-Perot filter 108 at the same angle $\theta$ 115 but from the opposite side and is reflected by Fabry-Perot filter 108. The two beams are effectively combined in a single beam containing the spectrums of the two laser diode sources and occupying the same space (spatially combined).

The lower portion of FIG. 1 illustrates the property of a Fabry-Perot filter 108 transmitting the output spectrum of a first laser diode 111 while reflecting the spectrum of a second laser diode 113. Transmission passband 120 of the Fabry-Perot filter 108 allows the collimated and linewidth narrowed beam 110 having spectral shape 111 to be transmitted through filter 108. The spectrum of second laser diode 113 located outside the passband of Fabry-Perot filter 108 is reflected. The use of spectrally narrowed laser diodes and narrowband Fabry-Perot filters makes it possible to closely space different spectrum from multiple laser diodes using wavelength combining techniques. Using multiple laser diodes, each having an output in a different spectral band, and combining spectrums provides a higher brightness output.

Figure 2:
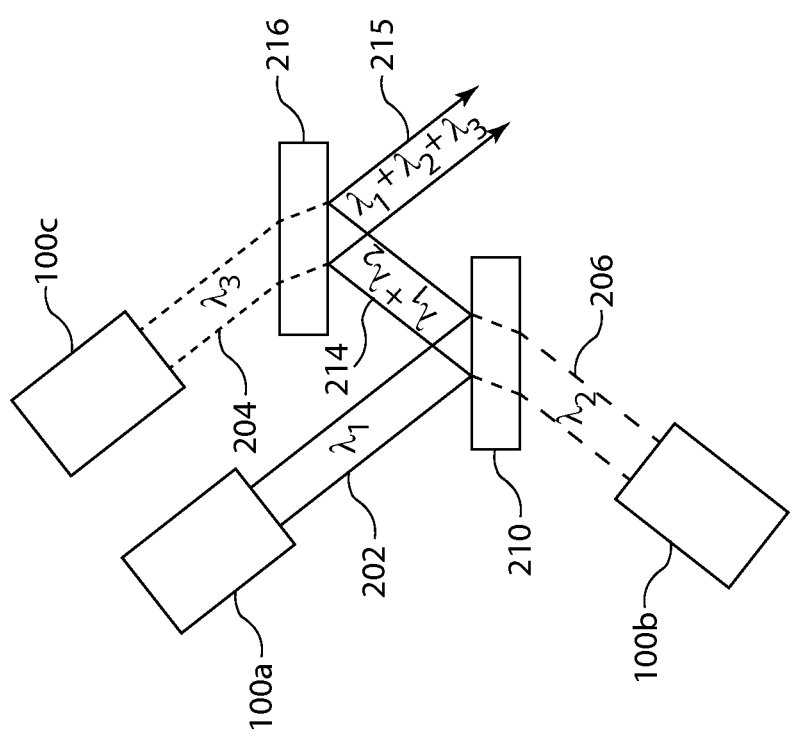
FIG. 2 depicts combining the outputs of three laser diodes each having a different center wavelength using Fabry-Perot filters.

FIG. 2 shows an example of wavelength and spatially combining the outputs of three laser diode sources. Specifically the light of laser diode source 100b, a second frequency narrowed laser diode of wavelength $\lambda_2$ passes through Fabry-Perot filter 210, and a first frequency narrowed laser diode source 100a having wavelength $\lambda_1$ impinges on Fabry-Perot filter 210 from the opposite side of the filter such that on reflection it shares the same physical space as the beam from the first source 100b. As a result, the two beams are effectively combined. As the Fabry-Perot filter is broadly reflective, multiple wavelengths can be brought together in this manner. A third frequency narrowed laser diode source of wavelength $\lambda_3$ passes through Fabry-Perot filter 216 while the combined beam 214 of the first source 100b and second source 100a are reflected thus effectively combining the three beams into a single beam 215.

Figure 3:
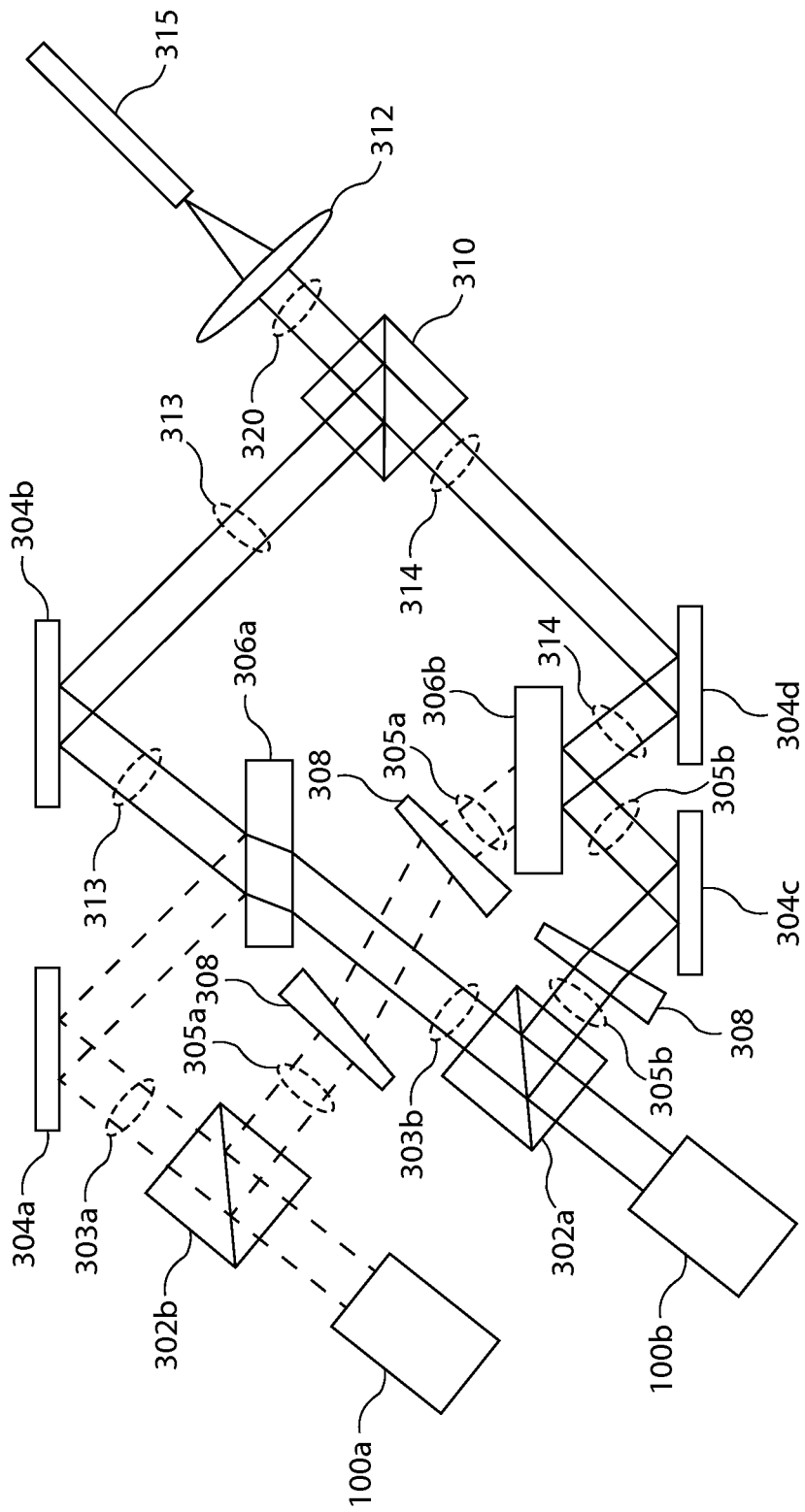
FIG. 3 is a simplified block diagram of an optical system wherein the outputs of multiple laser diodes are each polarization split into two polarization states, wavelength combining the same polarization state from the multiple laser diodes and using a polarization combining optical element to recombine the wavelength combined beams for the two polarizations states.

To overcome problems of unpolarized light from a laser diode source, the source beams are split into two orthogonal polarization states before wavelength combining. FIG. 3 is one embodiment illustrative of a technique to combine wavelength narrowed beams from multiple laser diodes to produce a high brightness output.

Outputs of two sources, first laser diode source 100a having a first spectral band and second laser diode source 100b having a second spectral band, are split using polarization beam splitters 302a and 302b. A first set of beams have a first polarization state, first beam 303a from source 100a and first beam 303b from source 100b. First beam 303a is directed towards a highly reflective mirror 304a which redirects the first beam 303a towards Fabry-Perot filter 306a where it is reflected. Second beam 303b is directed towards Fabry-Perot filter 306a where it is transmitted through the filter 306a and is effectively combined with first beam 303a. Combined beam 313 is then directed to highly reflective mirror 304b where the combined beam 313 is redirected towards polarization beam combiner 310. Fabry-Perot filter 306b comprises a first wavelength combining module.

The second set of beams have a second polarization state, second beam 305a from source 100a and second beam 305b from source 100b. Second beam 305b from source 100b is directed towards highly reflective mirror 304c which redirects the second beam 305b towards Fabry-Perot filter 306b where it is reflected. A prism 308 redirects second beam 305b so it impinges on highly reflective mirror 304c and is redirected at an angle such that the reflected second beam 305b impinges on Fabry-Perot filter 306b where second beam 305b reflects at the correct angle to be combined with second beam 305a. Second beam 305a from source 100a is directed towards Fabry-Perot filter 306b through a set of prisms 308 which correct the angle of incidence so it is transmitted through the filter 306b. Second beam 305a and second beam 305b are therefore effectively combined into a single combined beam 314. Fabry-Perot filter 306b comprises a second wavelength combining module.

Combined beam 314 is directed to highly reflective mirror 304d where it is redirected towards polarization beam combiner 310. Polarization beam combiner is placed so that the two combined beams, combined beam 313 and combined beam 314, each having a different polarization state are combined into a single output beam 320. This high brightness, high power laser diode output beam 320 can then be focused by lens 312 directly where it's needed or into a fiber 315 for transport to remote destination.

The prisms 308 used to redirect the path of a given beam are included for illustrative purposes only and may or may not be needed in any given system depending on the arrangement of optical elements. To increase the output power and brightness level additional laser diode sources are added to the system. Each laser diode source added necessitates the addition of two Fabry-Perot filters, one for each polarization state. One Fabry-Perot filter for the first polarization state and highly reflective mirror goes in the first wavelength combining module and the second Fabry-Perot filter and second highly reflective mirror goes in the second wavelength combining module. The Fabry-Perot filters are designed to pass the spectrum of only one laser diode source and handle one polarization state.

Figure 4:
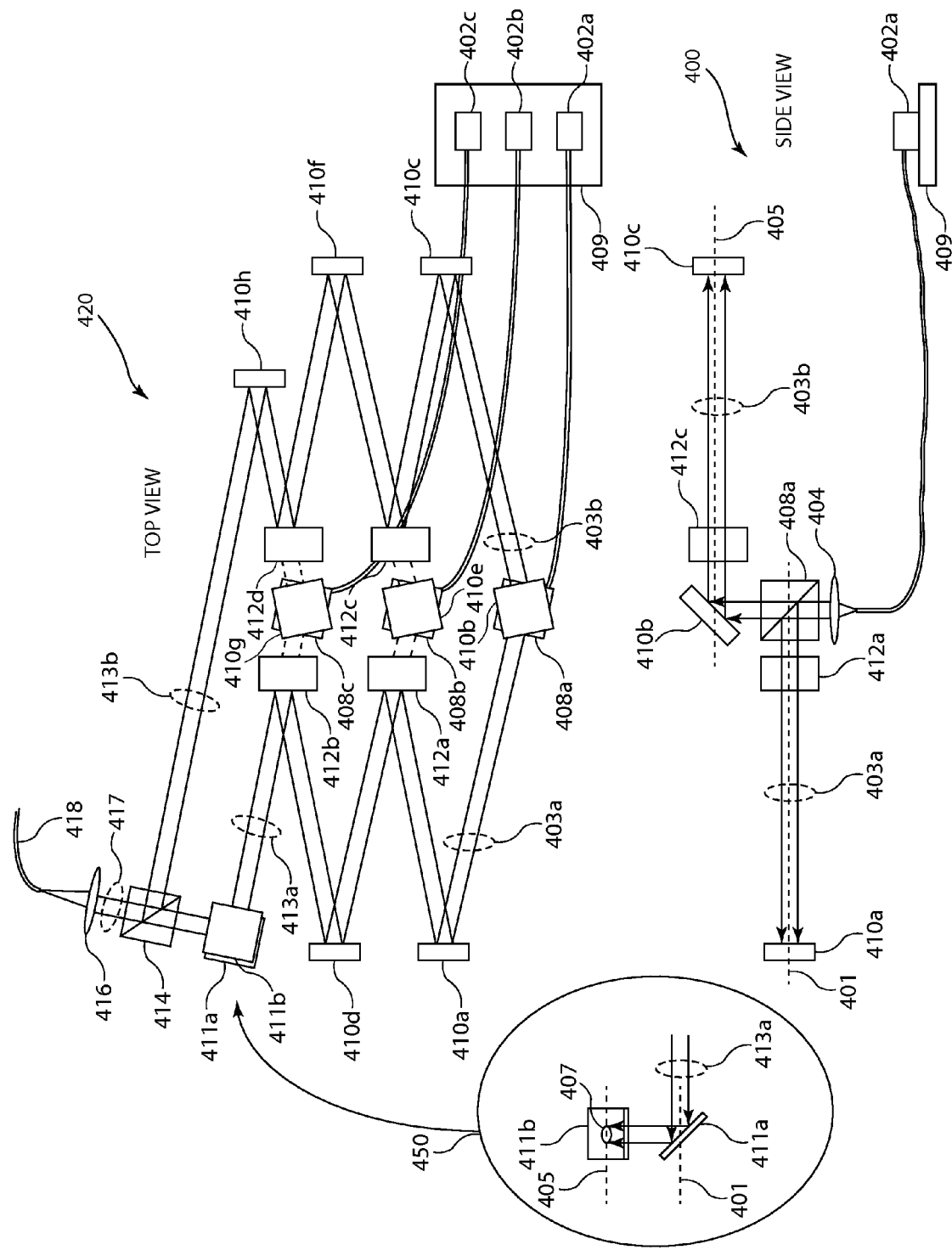
FIG. 4 depicts an alternate optical system that achieves polarization splitting, wavelength combining of the outputs from multiple laser diodes and finally recombines the two polarization states into a single output beam having high brightness.

A second embodiment is illustrated in FIG. 4 wherein the elements for two wavelength combining modules for the two polarization states are not co-planar, whereas in FIG. 3 all the beams for both polarization states lie in the same plane. Also, the laser diode sources are shown schematically mounted in common on a heat sink 409, located remotely from the optical assembly. The optical fibers from the laser diode sources deliver unpolarized, line-narrowed outputs from the laser diode sources to the assembly. This configuration can support large numbers of laser diode sources, including 10, 20 or more, as suits a particular implementation, each of which can deliver an output beam in spectral band on the order on a nanometer in width, or less. This enables many sources closely spaced spectrally, to be used for a high power, and relatively narrow band combined output.

Side view 400 depicts the output beam from a first laser diode source 402a split into two beams having different polarization states. A first beam 403a having a first polarization state is directed to a first plane 401 and a second beam 403b having a second polarization state is directed to a second plane 405.

Top view 420 shows three laser diode sources (402a, 402b, and 402c), each having a different spectral band, and three beam splitters (408a, 408b, and 408c). Each laser diode source is collimated and split into two polarization states (as shown in side view 400) by a beam splitter. Fabry-Perot filters (412a and 412b) located on the left hand side of the beam splitters handle wavelength combining of the three beams having the first polarization state and located in first plane 401 comprising a first wavelength combining module. Fabry-Perot filters (412c and 412d) located on the right hand side of the beam splitters handle wavelength combining of the three beams having the second polarization state and located in second plane 405 comprising a second wavelength combining module. Wavelength combining for each polarization state is performed as described with respect to FIG. 2.

A more detailed description of side view 400 follows. The output of a first fiber coupled laser diode source 402a is collimated by lens 404 before being directed to a polarization beam splitter 408a. Polarization beam splitter 408a splits the collimated beam from the laser diode source 402a into two orthogonal polarization states. First polarized beam 403a having a first polarization state is directed to highly reflective mirror 410a where it is redirected to Fabry-Perot filter 412a (see top view 420). Beam splitters 408a, 408b, and 408c, highly reflective mirrors 410a and 410d, and Fabry-Perot filters 412a and 412b are located in the first plane 401. Fabry-Perot filters 412a and 412d comprise a first wavelength combining module.

Second polarized beam 403b having a second polarization state passes directly through beam splitter 408a before being directed by highly reflective mirror 410b towards highly reflective mirror 410c. Highly reflective mirror 410c redirects second polarized beam 403b towards Fabry-Perot filter 412c (see top view 420). Highly reflective mirrors 410b, 410c and 410e, and Fabry-Perot filters 412c and 412d are located in the second plane 405. Fabry-Perot filters 412c and 412d comprise a second wavelength combining module.

Once the beams for each polarization state from all the laser diode sources have been wavelength combined the two polarization states must be recombined by polarization combiner 414. But first, one of the wavelength combined beams must be redirected to the same plane as the other wavelength combined beam. This is shown in insert 450 where combined beam 413a having a first polarization state is direct by highly reflective mirror 411a perpendicularly towards a second highly reflective mirror 411b. Second highly reflective mirror 411b directs combined beam 413a towards the polarization combiner 414 located in the second plane 405. The ellipse 407 denotes that combined beam 413a is directed in a direction perpendicular to the page.

Highly reflective turning mirror 410h redirects wavelength combined beam 413b formed by Fabry-Perot filter 412d towards polarization combiner 414 such that the wavelength combined beam 413a having a first polarization state is polarization combined with wavelength combined beam 413b having a second polarization state to form a single high brightness, high power output beam 417. High brightness, high power output beam 417 is then focused by lens 416 into a fiber 418. The fiber 418 may transport the light from output beam 417 to a remote position where it may be used for fiber laser pumping, solid state laser pumping, or cutting and welding using direct diode light. Alternatively, the high brightness, high power beam 417 may be directly focused onto a work piece such as two pieces of metal for laser welding.

Figure 5:
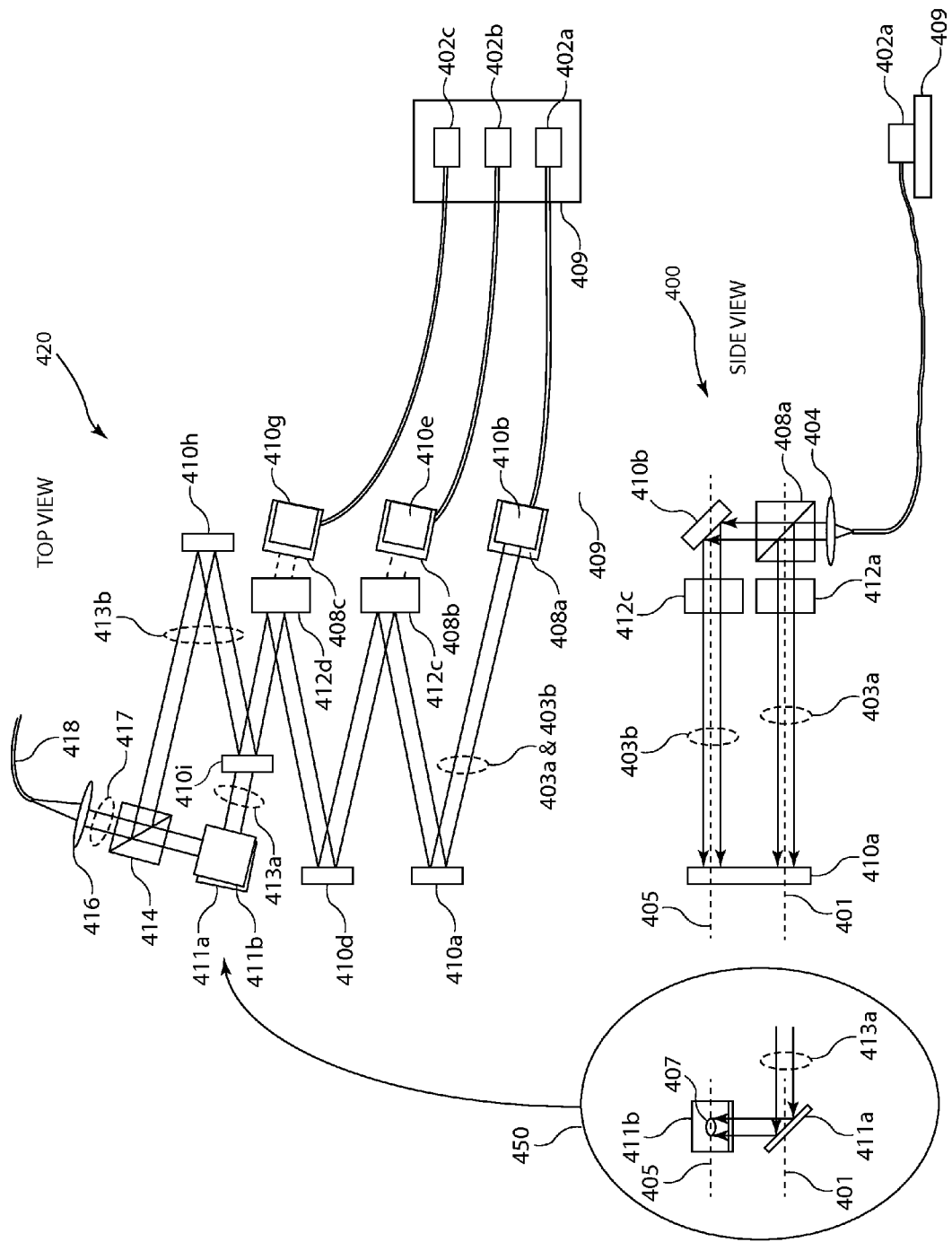
FIG. 5 depicts an alternate arrangement of FIG. 4 using fewer highly reflective mirrors and is more compact.

FIG. 5 depicts an alternate arrangement combining three laser diode sources as shown in FIG. 4 but occupying a small space and using fewer highly reflective turning mirrors. The laser diode sources are shown schematically mounted in common on a heat sink 409, located remotely from the optical assembly. The optical fibers from the laser diode sources deliver unpolarized, line-narrowed outputs from the laser diode sources to the assembly. The polarization beam splitters, Fabry-Perot filters, and the polarization beam combiner 414 operate as in FIG. 4. Highly reflective mirrors 410a and 410d do double duty by replacing highly reflective mirrors 410c and 410f by redirecting both polarization states. Highly reflective mirror 410a reflects both polarization states from laser diode source 402a. Similarly, high reflective mirror 410d reflects both polarization states of the beams from laser diode source 402b that have been wavelength combined with the respective polarized beams from laser diode source 402a. Highly reflective mirror 410i redirects wavelength combined beam 413b having the second polarization state to highly reflective mirror 410h. Highly reflective mirror 410h then directs combined beam 413b towards the polarization beam combiner 414 as it does in FIG. 4. Highly reflective mirrors 411a and 411b redirect wavelength combined beam 413a as described in FIG. 4.

Figure 6:
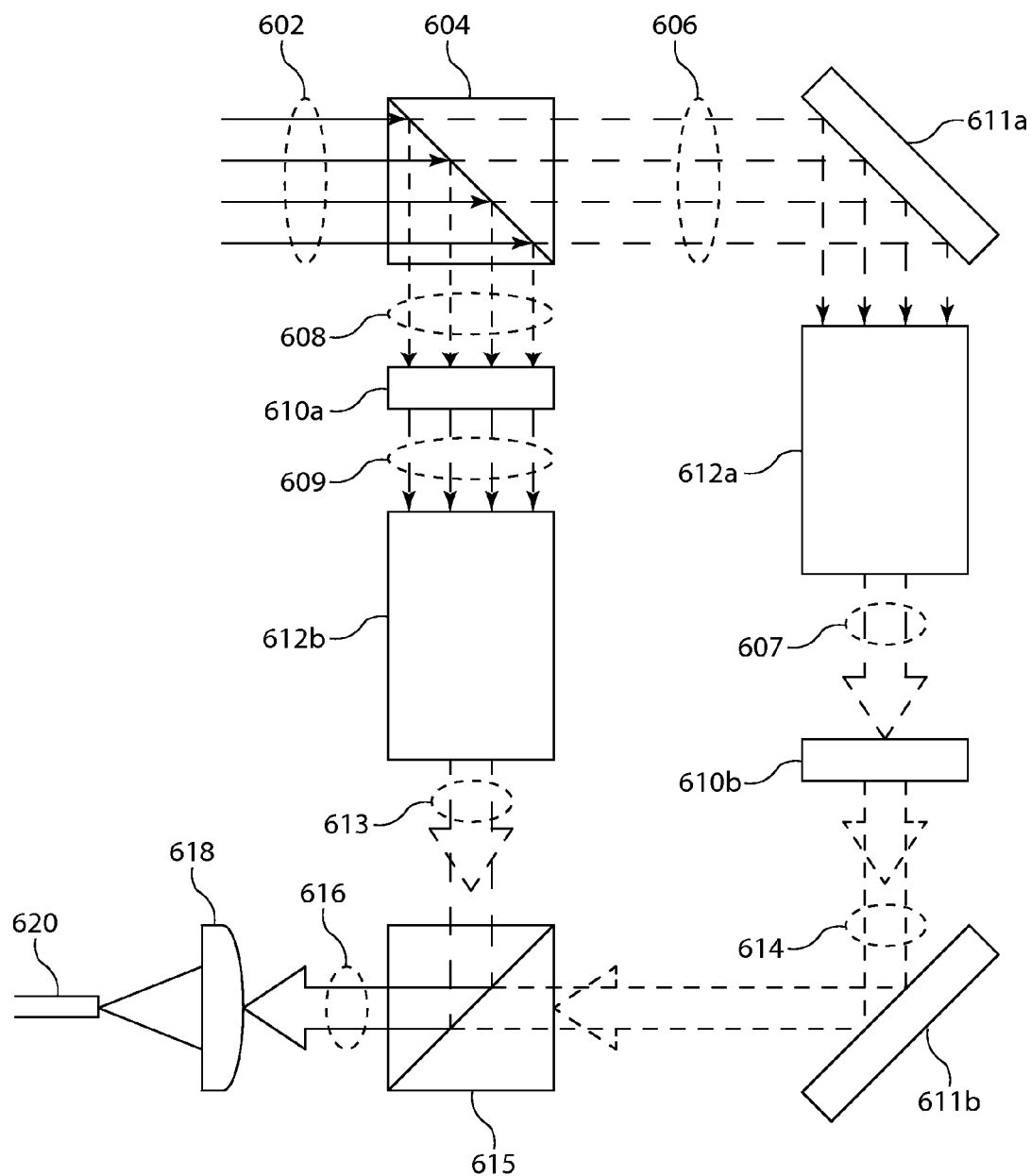
FIG. 6 depicts an embodiment wherein one polarization state is rotated such that identical wavelength combining modules may be used for the two polarization states thus simplifying the design.
Figure 7:
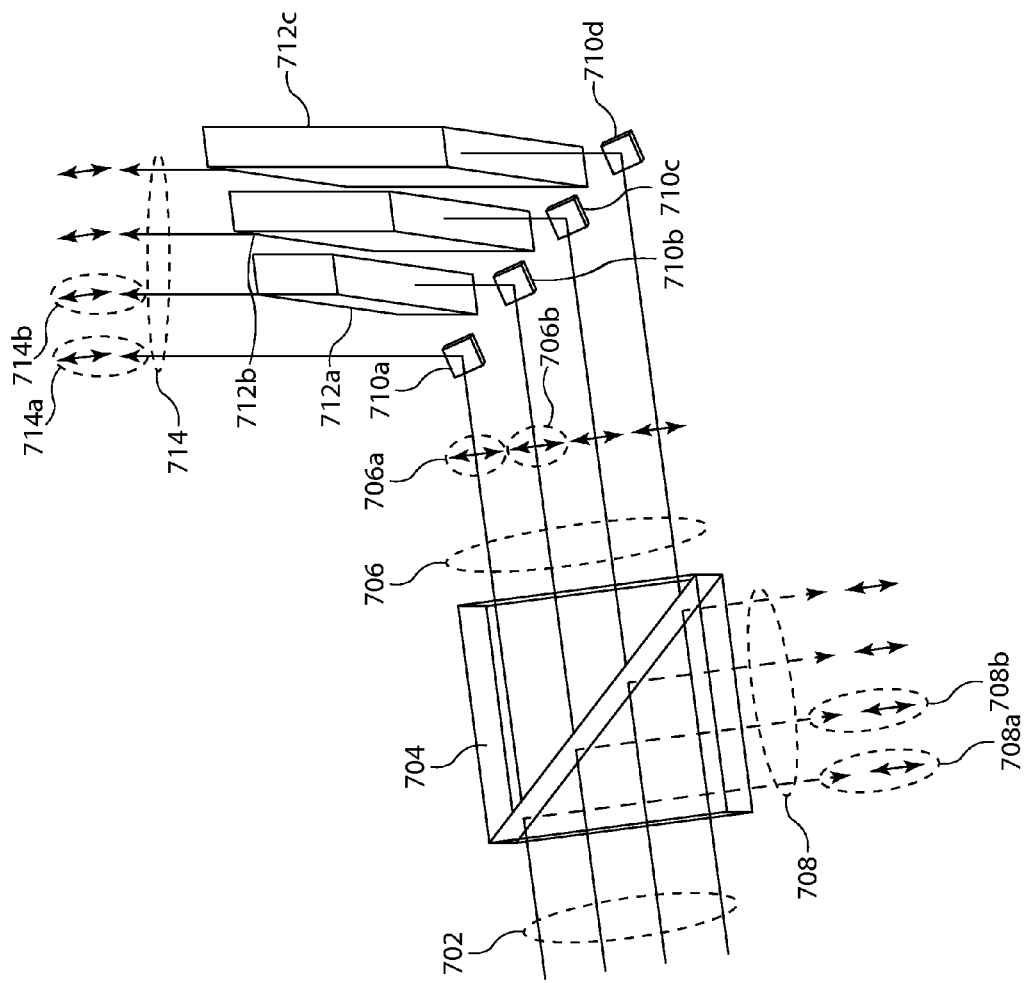
FIG. 7 depicts an alternate embodiment to rotate one polarization state by reformatting the beams of one of the polarization states so that identical wavelength combining modules may be used for the two polarization states.

In FIGS. 6 and 7 alternative embodiments are disclosed that simplify the design of the wavelength combining portion of the system. Two possible methods for rotating one the polarization states allows identical wavelength combining modules to be used for each polarization state.

FIG. 6 depicts an embodiment wherein one polarization state is rotated using a polarization rotator such that identical wavelength combining modules may be used for the two polarization states thus simplifying the design. Input beams 602 from multiple laser sources are polarization split by a polarization splitter 604 into a set of beams having a first polarization state 606 and a set of beams having a second polarization state 608. A mirror 611 directs the set of beams having a first polarization state 606 to pass through a wavelength combining module 612a. The set of beams having a second polarization state 608 pass through a polarization rotating module consisting of a polarization rotator 610a which rotates the polarization state of the set of beams having a second polarization state 608 to the same orientation as that of the first polarization state. The polarization rotator may be a half wave plate or any other device that rotates the polarization state by 90 degrees. This allows an identical wavelength combining module 612 to wavelength combine the set of beams having a second polarization state 609. This simplifies the design of the system since only one wavelength combining module need be designed and manufactured to handle the two polarization states. After wavelength combining, the first combined beam 607 is directed to a second polarization rotator 610b to the appropriate orientation and then redirected by mirror 611 to a polarization combiner 615. The second combined beam 613 is directed to polarization combiner 615 to be polarization combined with the first combined beam 614. The polarization combined beam 616 may then be focused by a lens 618 into a fiber 620 for transport to a work object.

FIG. 7 depicts an alternate embodiment to rotate one polarization state by reformatting the beams of one of the polarization states so that identical wavelength combining modules may be used for the two polarization states. The polarization reformatting module in this case consists of a set of staggered mirrors 710 and a set of path displacement elements 712. The input beams 702 from a multiple laser sources are polarization split by polarization splitter 704 into a first set of beams having a first polarization state 706 and a second set of beams having a second polarization state 708. The orientation of the two polarization states is depicted by double arrowhead lines. A set of staggered mirrors 710 are aligned such that a first staggered mirror 710a redirects a first beam 706a so that the first redirected beam 714a has the same orientation as the first beam having the second polarization state 708a. The second beam having the first polarization state 706b is redirected by mirror 710b to pass through a path displacement element 712a such that the second redirected beam 714b now has the same orientation as the second beam having the second polarization state 708b. The path displacement element aligns the second redirected beam 714b with the first redirected beam 714a such that they are the same distance apart as the first beam having the second polarization state 708a and the second beam having the second polarization state 708b. Each additional beam from the first set of beams having a first polarization state 706 is redirected by its corresponding staggered mirror 710 to a corresponding path displacement element 712. The result is a set of beams 714 having the same polarization orientation and alignment such that identical wavelength combining modules may be used to wavelength combine the two sets of beams. Once the two sets of beams are wavelength combined, one of the sets of beams must be polarization rotated or polarization reformatted using a second set of staggered mirror and path displacement elements before they can be polarization combined as described in FIG. 6. Any combination of polarization rotators and polarization reformatting modules may be used to implement a system where identical wavelength combining modules may be used to wavelength combine the beams of the two polarization states.

While the embodiments describe the wavelength combining modules with respect to Fabry-Perot filters as the wavelength combining elements other elements for wavelength combining are possible. Examples of other wavelength combining elements include prisms and gratings. Prisms refract beams having different wavelengths such that they are spatially combined. When prism combining is used, the wavelength combiner consists of a set of mounts that hold the collimated polarized wavelength stabilized beams with angle and position such that after passing through the prism the beams are spatially overlapped forming a common beam. Specifically, the wavelength outputs will be chosen in ascending or descending order with slightly different angles impinging on the prism so as to allow the chromatic aberration quality of the prism (change of index with wavelength) to effect the beam combination.

Gratings diffract beams having different wavelengths such that they are spatially combined. When grating combining is used, the wavelength combiner consists of a set of mounts that hold the collimated polarized wavelength stabilized beams in ascending or descending order in wavelength such that when the beams are directed at a common spot of the grating with slightly different incident angle the wavelength depended diffraction quality of the grating facilitates the spatial and wavelength overlap of the beams. Grating quality and design are chosen for either highly reflective operation or highly transmissive operation which may be an AR coated grating (which could be a volume holographic grating) fabricated from glass or other highly transmissive material such as fused silica.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A laser system, comprising:
   a plurality of unpolarized laser sources having outputs in different spectral bands; and
   a beam combining assembly, disposed to receive and combine the outputs of the unpolarized laser sources, the assembly including:
   a polarization beam splitter dividing the collimated outputs into first and second polarized sets of beams;
   a first wavelength combining module positioned to wavelength combine the first polarized set of beams onto a first common beam line;
   a second wavelength combining module positioned to wavelength combine the second polarized set of beams onto a second common beam line; and
   a polarization beam combiner disposed in the first and second common beam lines and configured to combine the first and second polarized sets of beams onto an output beam on a combined beam path.

2. The laser system of claim 1, further comprising:
   a first polarization rotation module disposed between the polarization beam splitter and the first wavelength combining module to rotate the first set of beams, and
   a second polarization rotation module disposed between the second wavelength combining module and the polarization beam combiner to rotate the second common beam line.

3. The laser system of claim 2, wherein the polarization rotating modules are comprised of:
   a polarization rotator; or
   a set of staggered mirrors and corresponding parallel plates.

4. The laser system of claim 3, wherein the polarization rotator is a half-wave plate.

5. The laser system claim 2, wherein the first and second wavelength combining modules are comprised of prisms, or gratings, or a plurality of filters having respective pass bands that correspond to the spectral bands of corresponding ones of the laser sources.

6. The laser system of claim 5, wherein the first wavelength combining module is comprised of a plurality of Fabry-Perot filters having respective pass bands that correspond to the spectral bands of corresponding ones of the laser sources.

7. The laser system of claim 5, wherein the second wavelength combining module is comprised of a plurality of Fabry-Perot filters having respective pass bands that correspond to the spectral bands of corresponding ones of the laser sources.

8. The laser system of claim 1, wherein at least one of the plurality of unpolarized laser sources includes a diode laser, including a line narrowing optic, and coupled to an optical fiber, wherein the unpolarized output of the optical fiber is the output of one of the unpolarized laser sources and a collimator aligned with output of the unpolarized laser source to provide a collimated output.

9. The laser system of claim 1, wherein the unpolarized laser sources in the plurality of unpolarized laser sources comprise heat sink mounted diode lasers, including respective line narrowing optics which are selective for wavelengths in the different spectral bands, the diode lasers being coupled to a plurality of optical fibers, wherein the unpolarized outputs of the optical fibers are the outputs of the unpolarized laser sources and a set of collimators aligned with respective outputs of the unpolarized laser sources to provide collimated outputs.

10. The laser system of claim 1, including a focusing optic in the combined beam path configured for coupling the output beam into an optical fiber.

11. A method to provide a combining a plurality of unpolarized laser beams in different spectral bands, comprising:
   providing a plurality of collimated unpolarized laser beams;
   dividing the collimated beams into first and second polarized sets of beams;
   using a first wavelength combining module to spatially combine the first polarized set of beams into a first combined polarized beam;
   using a second wavelength combining module to spatially combine the second polarized set of beams into a second combined polarized beam; and
   combining the first and second polarized beams onto a combined beam path.

12. The method of claim 11, further comprising the step of rotating the first polarized set of beams before wavelength combining and polarization rotating the second polarized beam after wavelength combining.

13. The method of claim 11, including supplying at least one of the unpolarized laser beams using a line-narrowed diode laser coupled to an optical fiber, the output of the optical fiber being the unpolarized laser beam.

14. The method of claim 11, including supplying at least some of the unpolarized laser beams using heat sink mounted, line-narrowed diode lasers in different spectral bands, coupled to respective optical fibers, the outputs of the optical fibers being the unpolarized laser beams.

15. An optical assembly, comprising:
   a polarization beam splitter configured to split a plurality of unpolarized laser beams, each beam having a different spectral band into a first set of beams having a first polarization state and a second set of beams having a second polarization state;

a first wavelength combining module in functional communication with the polarization beam splitter and configured to combine the first set of beams having the first polarization state to form a first wavelength combined beam having the first polarization and combined spectral bands;

a second wavelength combining module in functional communication with the polarization beam splitter and configured to combine the second set of beams having the second polarization state to form a second wavelength combined beam having the second polarization and combined spectral bands; and a polarization beam combiner in functional communication with each of the first and second wavelength combining modules and aligned to combine the first wavelength combined beam having the first polarization and the second wavelength combined beam having the second polarization into a single output beam.

16. The optical assembly of claim 15, further comprising:
a first polarization rotation module disposed between the polarization beam splitter and the first wavelength combining module to rotate the first set of beams, and
a second polarization rotation module disposed between the second wavelength combining module and the polarization beam combiner to rotate the second wavelength combined beam.

17. The optical assembly of claim 16, wherein the first and second wavelength combining modules together consist essentially of a single wavelength combining module that is tuned to a single polarization direction.

18. The optical assembly of claim 16, wherein the first and second wavelength combining modules are comprised of prisms, or gratings, or a plurality of filters having respective pass bands that correspond to the spectral bands of corresponding ones of the laser sources.

19. The optical assembly of claim 18, wherein the first wavelength combining module and the second wavelength combining module comprise respective sets of Fabry-Perot filters.

20. An optical system providing a high brightness, high power laser diode output, comprising:
a plurality of fiber coupled, line-narrowed laser diodes providing a plurality of unpolarized laser diode beams;
a polarization beam splitter optically coupled to the unpolarized laser diode beams to split the plurality of unpolarized laser diode beams from the laser diode sources, each laser diode source having a different spectral band into a first set of beams having a first polarization state and a second set of beams having a second polarization state;
a first polarization rotation module disposed between the polarization beam splitter and the first wavelength combining module to rotate the first set of beams, and
a first wavelength combining module optically coupled to the polarization beam splitter to combine the first set of beams having the polarization rotated first polarization state to form a first wavelength combined beam having the polarization rotated first polarization state and combined spectra;
a second wavelength combining module optically coupled to the polarization beam splitter to combine the second set of beams having the second polarization state to form a second wavelength combined beam having the second polarization state and combined spectra; and
a second polarization rotation module disposed between the second wavelength combining module and the polarization beam combiner to rotate the second wavelength combined beam.
a polarization beam combiner optically coupled to each of the first and second wavelength combining modules to combine the first wavelength combined beam having the polarization rotated first polarization state and the second wavelength combined beam having the polarization rotated second polarization state into a single output beam.

21. The optical system of claim 20, wherein the first and second wavelength combining modules are comprised of prisms, or gratings, or a plurality of filters having respective pass bands that correspond to the spectral bands of corresponding ones of the laser sources.

22. The optical system of claim 21, wherein the first wavelength combining module and the second wavelength combining module comprise respective sets of Fabry-Perot filters.

23. An optical system providing a high brightness, high power laser diode output, comprising:
a plurality of fiber coupled, line-narrowed laser diodes providing a plurality of collimated unpolarized laser diode beams;
a polarization beam splitter optically coupled to the collimated unpolarized laser diode beams to split the plurality of collimated unpolarized laser diode beams from the laser diode sources, each laser diode source having a different spectral band into a first set of beams having a first polarization state and a second set of beams having a second polarization state;
a wavelength combining module optically coupled to the polarization beam splitter to combine each of the first and second set of beams having the first and second polarization state, respectively, to form first and second wavelength combined beams, respectively, having first and second polarization states, respectively, and combined spectra;
a polarization beam combiner optically coupled to the wavelength combining module to combine the first wavelength combined beam having the first polarization state and the second wavelength combined beam having the second polarization state into a single output beam;
a first polarization rotation module disposed between the polarization beam splitter and the wavelength combining module to rotate the first set of beams, and
a second polarization rotation module disposed between the wavelength combining module and the polarization beam combiner to rotate the second wavelength combined beam.

* * * * *